(12) United States Patent
Kang et al.

(10) Patent No.: US 10,491,203 B2
(45) Date of Patent: Nov. 26, 2019

(54) DUTY CYCLE CORRECTORS AND METHODS OF OPERATING THE SAME

(71) Applicants: Samsung Electronics Co., Ltd., Suwon-si, Gyeonggi-do (KR); Research & Business Foundation SUNGKYUNKWAN UNIVERSITY, Suwon-si, Gyeonggi-do (KR)

(72) Inventors: Kyoungtae Kang, Seoul (KR); Kang Yoon Lee, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 16/006,107

(22) Filed: Jun. 12, 2018

(65) Prior Publication Data

US 2019/0165774 A1 May 30, 2019

(30) Foreign Application Priority Data

Nov. 27, 2017 (KR) ........................ 10-2017-0159674

(51) Int. Cl.
*H03K 3/017* (2006.01)
*H03K 5/156* (2006.01)
*H03K 5/133* (2014.01)
*H03K 5/00* (2006.01)

(52) U.S. Cl.
CPC ........... *H03K 5/1565* (2013.01); *H03K 5/133* (2013.01); *H03K 2005/00052* (2013.01)

(58) Field of Classification Search
CPC ....... H03L 7/091; H03L 7/093; H03L 7/0814; H04L 7/033; H04L 7/0337
See application file for complete search history.

(56) References Cited

U.S. PATENT DOCUMENTS

| | | | |
|---|---|---|---|
| 7,184,509 | B2 | 2/2007 | Cho et al. |
| 7,212,055 | B2 | 5/2007 | Yoo et al. |
| 8,384,458 | B1 | 2/2013 | Huang |
| 9,485,086 | B2 | 11/2016 | Gorecki et al. |
| 9,537,475 | B1 | 1/2017 | Iorga |
| 9,571,077 | B1 | 2/2017 | Iorga et al. |

(Continued)

FOREIGN PATENT DOCUMENTS

KR 10-1074453 B1 10/2011

*Primary Examiner* — Sibin Chen
(74) *Attorney, Agent, or Firm* — Harness, Dickey & Pierce, P.L.C.

(57) ABSTRACT

A duty cycle corrector includes a delay chain, an edge detector, a falling edge shift (FES) controller, a plurality of falling edge modulator (FEM) cores, and a phase interpolator. The delay chain delays a first clock to generate a delay clock, and generates first and second sampling control signals. The edge detector samples the first clock and a second clock using the first and second sampling control signals to obtain first and second sampling signals. The FES controller determines a modulation direction and a modulation width based on the first and second sampling signals. The plurality of FEM cores first modulate the first edge of the first clock and second modulate the first edge of the delay clock using the modulation direction and the modulation width. The phase interpolator performs phase interpolation on the results of the first and second modulations.

20 Claims, 13 Drawing Sheets

(56) References Cited

U.S. PATENT DOCUMENTS

2009/0067541 A1\* 3/2009 Byun .................... H03F 1/0294
                                                           375/297
2011/0109354 A1   5/2011 Feng et al.

\* cited by examiner

DUTY CYCLE CORRECTORS AND METHODS OF OPERATING THE SAME

CROSS-REFERENCE TO RELATED APPLICATION

This U.S. non-provisional application claims the benefit of priority under 35 U.S.C. § 119 of Korean Patent Application No. 10-2017-0159674, filed on Nov. 27, 2017, in the Korean Intellectual Property Office, the disclosure of which is hereby incorporated by reference in its entirety.

BACKGROUND

Some example embodiments relate to duty cycle correctors, more particularly, to duty cycle correctors using an open-loop mode and configured to modulate a falling edge to correct a duty cycle.

A parallel interface circuit using a double data rate (DDR) mode latches data on a rising edge or a falling edge of a clock. Therefore, when a duty cycle of the clock is 50%, a valid window is large and, as a result, the amount of data error decreases. However, due to design, layout, and various peripheral factors of the interface circuit, the duty cycle of the clock is not always maintained at 50%. A duty cycle corrector is used to correct the duty cycle to 50%.

Generally, the duty cycle corrector uses a closed-loop mode or an open-loop mode. Since the duty cycle corrector using the closed-loop mode uses a feedback signal to correct the duty cycle, there is an advantage that a reliability of the duty cycle correction is improved. However, the closed-loop mode involves a delay to stabilize a feedback circuit, thereby decreasing the speed of duty cycle correction. On the other hand, the duty cycle corrector using the open-loop mode has a higher speed, but is less reliable than the duty cycle corrector using the closed-loop mode.

The duty cycle corrector using the open-loop mode includes a phase interpolator. When the phase interpolator is used, if the clock is out of an interpolating range (that is, the range where a linearity of the interpolating is known), the duty cycle is not corrected because the interpolating is not properly performed. Therefore, when the duty cycle is corrected, it is important to improve both the reliability and the speed of the duty cycle correction.

SUMMARY

Some example embodiments provide a duty cycle corrector using an open-loop mode and capable of improving a speed of a duty cycle correction.

Some example embodiments provide a duty cycle corrector using an open-loop mode and capable of correcting a duty cycle even if a clock is out of an interpolating range.

According to some example embodiments, a duty cycle corrector includes a delay chain configured to delay a first clock to generate a delay clock, and generate a first sampling control signal based on a first edge of the first clock and a second sampling control signal based on a second edge of the first clock. The duty cycle corrector further includes an edge detector configured to sample the first clock using the first sampling control signal to obtain a first sampling signal, and sample a second clock having an opposite phase to the first clock using the second sampling control signal to obtain a second sampling signal. The duty cycle corrector further includes a falling edge shift (FES) controller configured to determine a modulation direction and a modulation width of the first edge of the first clock based on the first sampling signal and the second sampling signal. The duty cycle corrector further includes a plurality of falling edge modulator (FEM) cores configured to, first modulate the first edge of the first clock to obtain a first modulation result, and second modulate a first edge of the delay clock to obtain a second modulation result, the first modulation and the second modulation being performed using the modulation direction and the modulation width. The duty cycle corrector further includes a phase interpolator configured to perform phase interpolation on the first modulation result and the second modulation result.

According to some example embodiments, a duty cycle corrector includes a falling edge shift controller configured to determine a modulation direction and a modulation width of a falling edge of a first clock based on a difference between a logic high period and a logic low period of the first clock. The duty cycle corrector further includes a first falling edge modulator core configured to modulate the falling edge of the first clock based on a result of the determination to obtain a first modulation result. The duty cycle corrector further includes a second falling edge modulator core configured to modulate a falling edge of a second clock inverted and delayed from the first clock based on the result of the determination to obtain a second modulation result. The duty cycle corrector further includes phase interpolator configured to perform a phase interpolation on the first modulation result and the second modulation result.

According to some example embodiments, a method performed by a duty cycle corrector for correcting a duty cycle of a first clock includes detecting a difference between a logic high period and a logic low period of the first clock, determining a modulation direction and a modulation width of a falling edge of the first clock based on the difference, first modulating the falling edge of the first clock based on a result of the determination, second modulating a falling edge of a second clock inverted and delayed from the first clock based on the result of the determination, and performing a phase interpolation based on the first modulating and the second modulating.

According to the above, the duty cycle corrector improves the reliability and the speed of the duty cycle correction.

BRIEF DESCRIPTION OF THE DRAWINGS

The above and other objects and features will become apparent by describing in detail some example embodiments with reference to the accompanying drawings.

DETAILED DESCRIPTION

Below, some example embodiments are be described in detail and clearly to such an extent that an ordinary one in the art easily implements the example embodiments.

Figure 1:
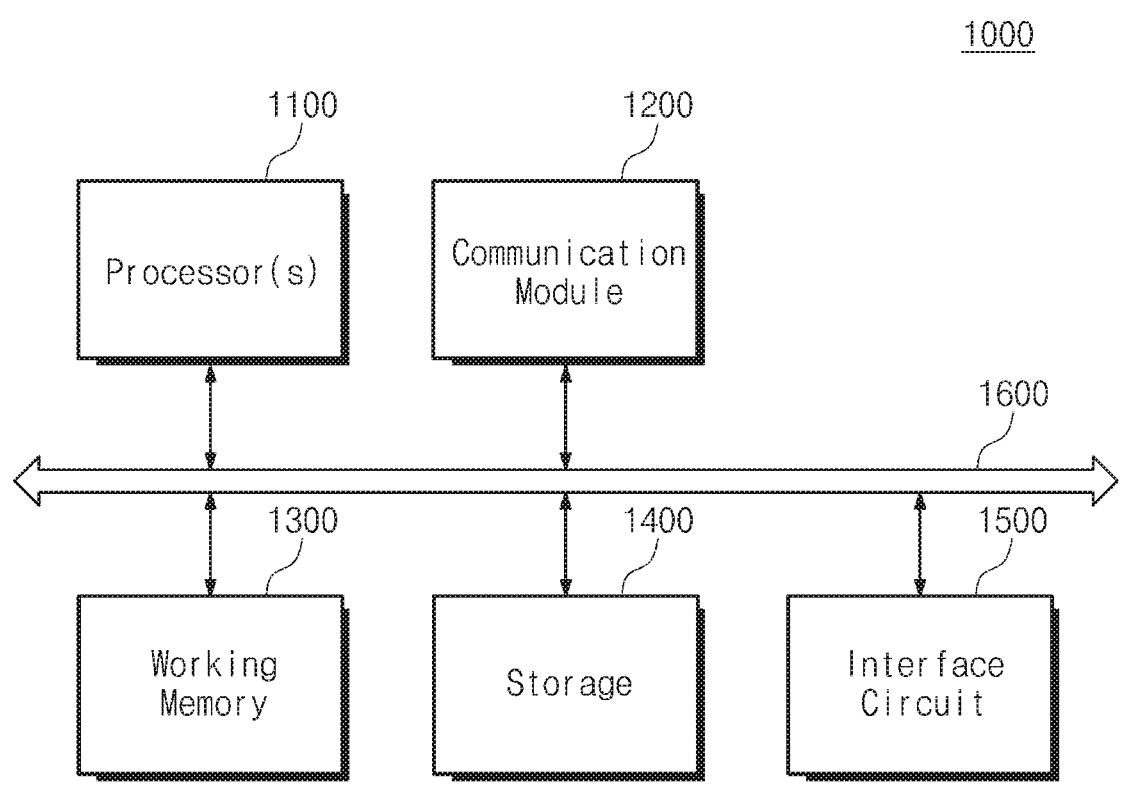
FIG. 1 is a block diagram illustrating an electronic device including an interface circuit 1500 according to some example embodiments.

FIG. 1 is a block diagram illustrating an electronic device 1000 including an interface circuit 1500 according to some example embodiments.

Referring to FIG. 1, the electronic device 1000 may include at least one a processor 1100, a communication module 1200, a working memory 1300, a storage 1400, an interface circuit 1500, and a bus 1600. For example, the electronic device 1000 may be an electronic device such as a desktop computer, a laptop computer, a tablet, a smart phone, a wearable device, a video game console, a workstation, a server, and an electric vehicle.

The processor 1100 may control the overall operations of the electronic device 1000. The processor 1100 may process various types of arithmetic operations and/or logical operations. The processor 1100 may include an application-specific integrated circuit (ASIC), a field-programmable gate array (FPGA), a dedicated microprocessor, a microprocessor, and the like. For example, the processor 1100 may include one or more processor cores and may be implemented as a general purpose processor, the dedicated microprocessor, or an application processor.

The communication module 1200 may communicate with an external device/system of the electronic device 1000. For example, the communication module 1200 may be a function block, a circuit, and/or a semiconductor chip manufactured separately from the processor 1100. Also, when the processor 1100 is implemented as the application processor, at least some of the functions of the communication module 1200 may be merged in the processor 1100.

The communication module 1200 may support at least one of various wireless communication protocols such as long term evolution (LTE), worldwide interoperability for microwave access (WIMAX), global system for mobile communications (GSM), code division multiple access (CDMA), Bluetooth, near field communication (NFC), wireless fidelity (Wi-Fi), radio frequency identification (RFID), and the like and/or at least one of various wire communication protocols such as a transfer control protocol/ internet protocol (TCP/IP), universal serial bus (USB), firewire, and the like.

The working memory 1300 may store data used in the operations of the electronic device 1000. For example, the working memory 1300 may temporarily store data processed or to be processed by the processor 1100. The working memory 1300 may include a volatile memory such as a dynamic random access memory (DRAM), a synchronous dynamic random access memory (SDRAM), and the like and/or a nonvolatile memory such as a phase-change random access memory (PRAM), a magneto-resistive random access memory (MRAM), a resistive random access memory (ReRAM), a ferro-electric random access memory (FRAM), and the like.

The storage 1400 may include one or more memory devices and a controller. The memory device of the storage 1400 may store data regardless of a power supply. For example, the storage 1400 may include the nonvolatile memory such as a flash memory, PRAM, MRAM, ReRAM, FRAM, and the like. The storage 1400 may include a storage medium such as a solid state drive, a removable storage, an embedded storage, and the like.

The interface circuit 1500 may provide various interfacing environments for exchanging data between components of the electronic device 1000 (e.g., the processor 1100, the communication module 1200, the working memory 1300 and the storage 1400) or between the electronic device 1000 and an external device. For example, the interface circuit 1500 may include a parallel interface circuit using a double data rate (DDR) mode. Additionally, the interface circuit 1500 may include a duty cycle corrector to correct a duty cycle of a clock used to exchange data with the working memory 1300 or the storage 1400.

The bus 1600 may provide a communication path between the components of the electronic device 1000 (e.g., the processor 1100, the communication module 1200, the working memory 1300, the storage 1400 and the interface circuit 1500). The components of the electronic device 1000 may exchange data with each other based on a bus format of the bus 1600. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), erial ATA (SATA), serial attached SCSI (SAS), integrated drive electronics (IDE), enhanced IDE (EIDE), nonvolatile memory express (NVMe), universal flash storage (UFS), and the like.

Figure 2:
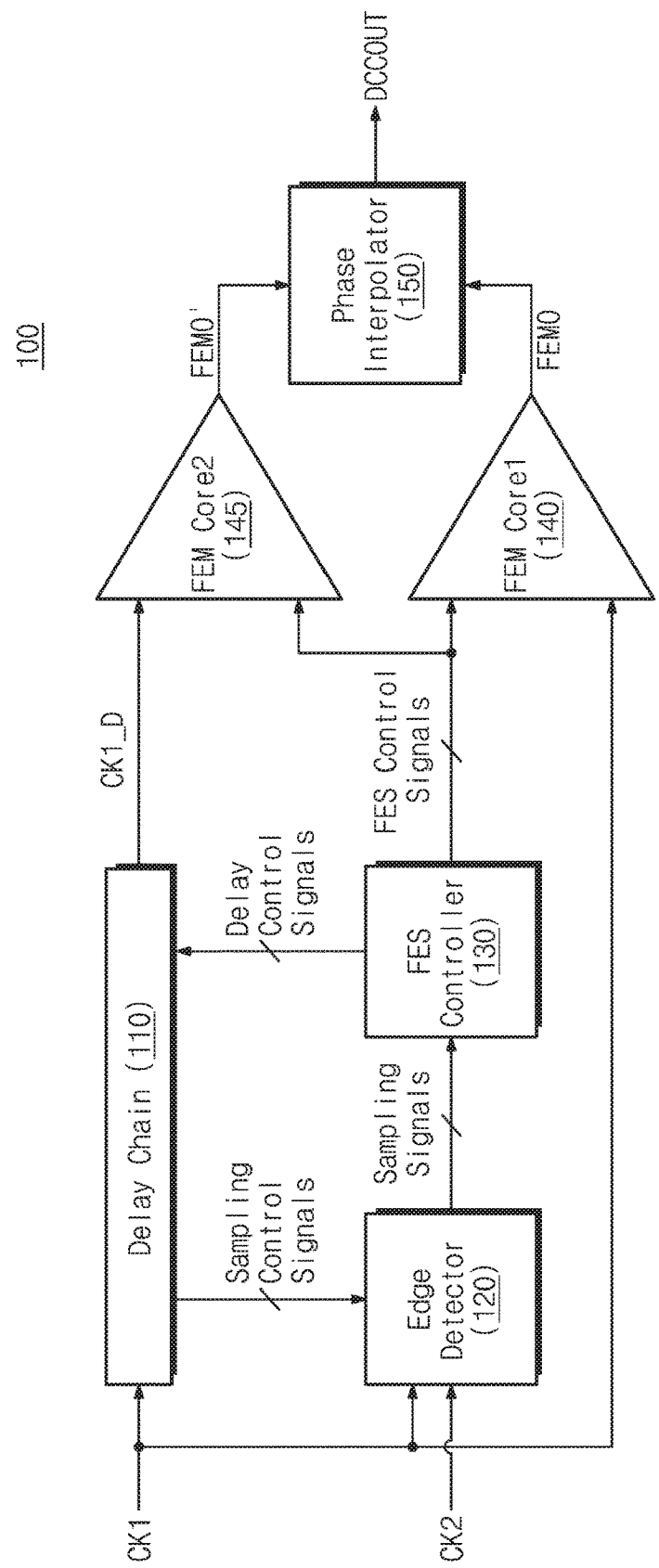
FIG. 2 is a block diagram illustrating an example configuration of a duty cycle corrector according to some example embodiments.

FIG. 2 is a block diagram illustrating an example configuration of a duty cycle corrector 100 according to some example embodiments. The duty cycle corrector 100 may include a delay chain 110, an edge detector 120, a falling edge shift (FES) controller 130, a first falling edge modulator (FEM) core 140, a second FEM core 145, and a phase interpolator 150. According to some example embodiments, the delay chain 110, the edge detector 120, the first FEM core 140, the second FEM core 145 and the phase interpolator 150 may be implemented using hardware (e.g., circuitry) as discussed further below. According to some example embodiments, the implementation of the FES controller 130 is as discussed in association with FIG. 6.

The delay chain 110 may be configured to delay a first clock CK1. For example, the delay chain 110 may invert the first clock CK1 and delay the inverted first clock CK1 to match a rising edge of the inverted first clock CK1 to the first clock CK1. Hereinafter, in the present specification, the inverted/delayed first clock CK1 having a rising edge matched to the rising edge of the inverted first clock CK1 is referred to as a delay clock CK1_D.

The delay chain 110 may be configured to generate sampling control signals. The sampling control signals may be signals used to sample the first clock CK1 and a second clock CK2. The sampling control signals may include a clock based on a rising edge of the first clock CK1 and a clock based on a falling edge of the first clock CK1. For example, clocks adjacent to each other among clocks of the sampling control signals may be delayed by τ from each other.

The delay chain 110 may include a plurality of AND gates and/or a plurality of NAND gates. For example, the plurality of AND gates and/or the plurality of NAND gates may be controlled by delay control signals generated by the FES controller 130. For example, according to the control of the delay control signals, a degree (e.g., amount) to which the delay clock CK1_D is delayed may be adjusted.

The edge detector 120 may sample the first clock CK1 and the second clock CK2 using the sampling control signals. The edge detector 120 may sample the first clock CK1 using the sampling control signals so that a time point at which a bit value of the first clock CK1 transits from logic "0" to logic "1" may be captured. Similarly, the edge detector 120 may sample the second clock CK2 using the sampling control signals so that a time point at which a bit value of the second clock CK2 transits from logic "0" to logic "1" may be captured.

The FES controller 130 may be configured to generate the delay control signals based on the sampling signals. For example, the degree to which the delay clock CK1_D is delayed (e.g., width) may be controlled by the delay control signals. For example, the plurality of AND gates and/or the plurality of NAND gates of the delay chain 110 may be appropriately driven by the delay control signals so that the number of logic gates through which the first clock CK1 passes may be adjusted.

The FES controller 130 may be configured to generate FES control signals based on the sampling signals. For example, the FES controller 130 may generate a signal that controls whether to increase or decrease the duty cycle of the first clock CK1. Additionally, the FES controller 130 may generate a signal that controls a modulated width of the first clock CK1.

The first FEM core 140 may be configured to modulate the falling edge of the first clock CK1 based on the FES control signals. For example, the first FEM core 140 may include a plurality of inverter chains for generating a lead signal, a neutral signal, or a lag signal based on the first clock CK1. Additionally, the first FEM core 140 may include logic gates for combining the lead signal, the neutral signal, and the lag signal to generate a signal whose falling edge of the first clock CK1 is modulated.

The second FEM core 145 may be configured to modulate a falling edge of the delay clock CK1_D based on the FES control signals. A configuration and an operation of the second FEM core 145 are substantially similar to or the same as that of the first FEM core 140. However, the second FEM core 145 may operate in opposition to the first FEM core 140 so that an interpolation is performed by the phase interpolator 150. For example, when the first FEM core 140 performs an operation to advance the falling edge of the first clock CK1, the second FEM core 145 performs an operation to delay the falling edge of the delay clock CK1_D.

The phase interpolator 150 may be configured to perform the interpolation using a falling edge modulation signal FEMO and a falling edge modulation signal FEMO'. As a result, a duty cycle correction signal DCCOUT may be output.

Figure 3:
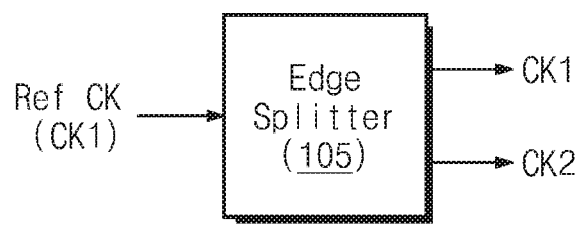
FIG. 3 is a block diagram illustrating an edge splitter according to some example embodiments.

The first clock CK1 and the second clock CK2 may be generated from a similar clock or the same clock. For example, the duty cycle corrector 100 may further include an edge splitter 105 as shown in FIG. 3. Referring to FIG. 3, the edge splitter 105 receives a reference clock Ref CK and may generate the first clock CK1 and the second clock CK2 having an opposite phase to each other. For example, the first clock CK1 may be a similar signal or the same signal as the reference clock Ref CK. According to some example embodiments, the edge splitter 105 may be implemented using hardware (e.g., circuitry).

According to the duty cycle corrector 100 briefly described above, a disadvantage of the duty cycle corrector using the open-loop mode may be solved. That is, two FEM cores 140 and 145 are used to perform opposite operations to each other (e.g., the operation increasing the duty cycle and the operation decreasing the duty cycle), the interpolating is performed on output pulses of the FEM cores 140 and 145, and as a result, a clock whose duty cycle is corrected may be output.

Even if a complete falling edge modulation is not performed by the first FEM core 140 and the second FEM core 145, the effect of variations in a manufacturing process, voltage, and temperature may be offset when the interpolating is performed on the falling edge modulation signals FEMO and FEMO' whose falling edge is modulated in opposite direction to each other.

Figure 4:
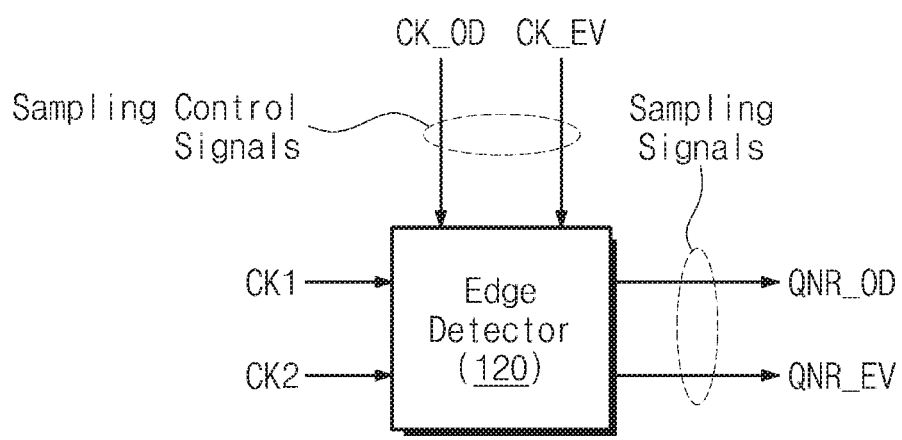
FIG. 4 is a block diagram illustrating signal processing by the edge detector.

FIG. 4 is a block diagram illustrating signal processing by the edge detector 120. Referring to FIG. 4, the sampling control signals may include a first sampling control signal CK_OD and a second sampling control signal CK_EV. The sampling signals may include a first sampling signal QNR_OD and a second sampling signal QNR_EV. The first sampling signal QNR_OD may be a signal obtained by sampling the first clock CK1 using the first sampling control signal CK_OD. The second sampling signal QNR_EV may be a signal obtained by sampling the second clock CK2 using the second sampling control signal CK_EV.

The edge detector 120 may include various elements for storing and collecting sampling results. For example, the edge detector 120 may include flip-flops for storing the sampling results by the first sampling control signal CK_OD and OR gates for collecting the sampling results stored in the flip-flops. Similarly, the edge detector 120 may include flip-flops and OR gates associated with the second sampling control signal CK_EV.

Figure 5:
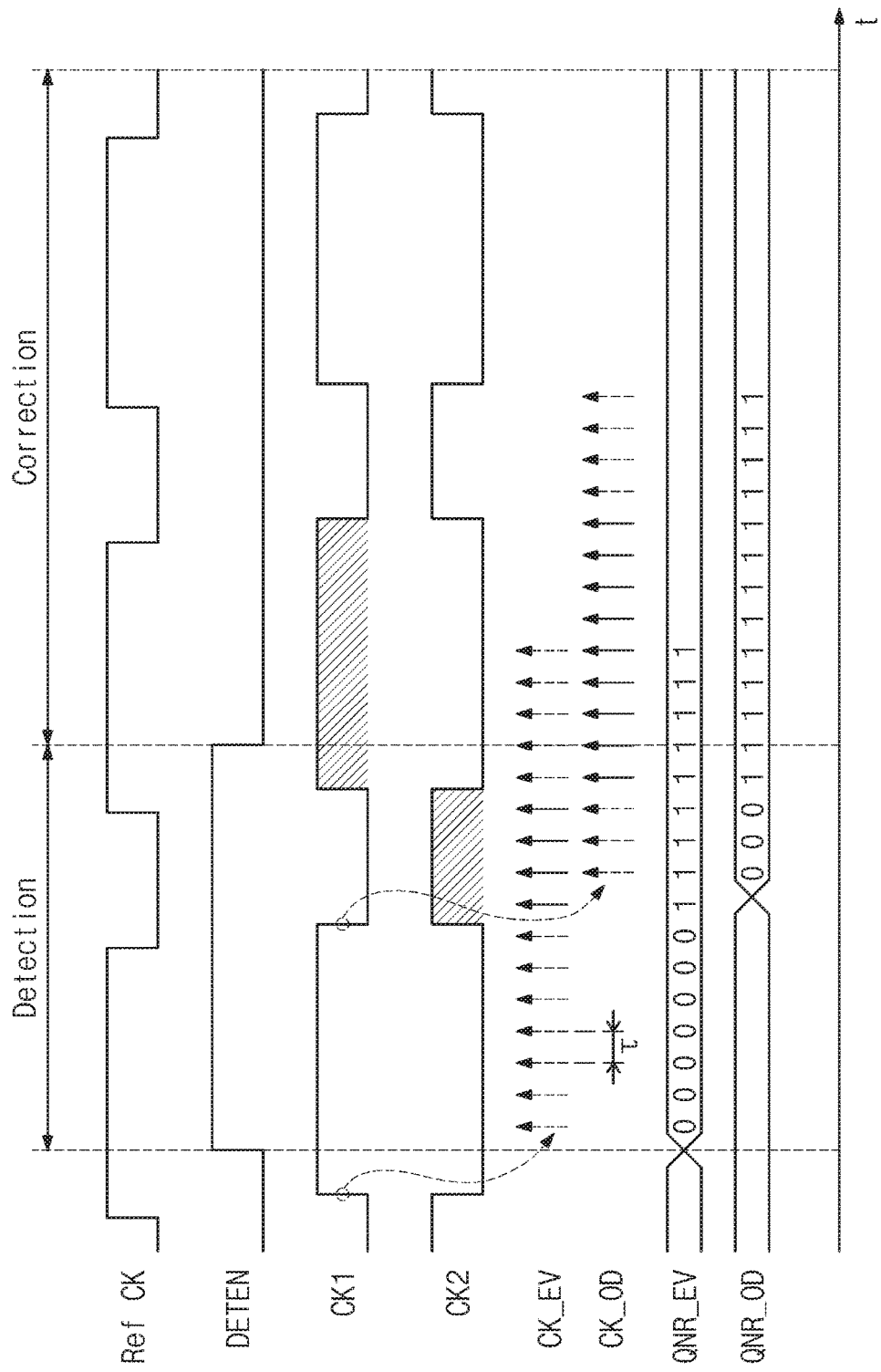
FIG. 5 is a timing diagram illustrating a process of generating the first sampling signal and the second sampling signal.

FIG. 5 is a timing diagram illustrating a process of generating the first sampling signal QNR_OD and the second sampling signal QNR_EV. For better understanding, FIGS. 2 to 4 will be referred to and described together.

The first clock CK1 and the second clock CK2 may be generated based on the reference clock Ref CK. The reference clock Ref CK may be a substantially similar clock or the same clock as the first clock CK1, but the first clock CK1 is shown slightly delayed with respect to the reference clock Ref CK due to an operation of the edge splitter 105.

A mask signal DETEN may be signal for separating a detection period and a correction period. A duty error may be detected in a period in which the mask signal DETEN is activated and the duty cycle may be corrected in a period in which the mask signal DETEN is inactivated. For example, the period in which the mask signal DETEN is activated may be similar to or the same as one period of the first clock CK1. As will be detailed later, the mask signal DETEN may be generated in the FES controller 130.

The delay chain 110 may generate the first sampling control signal CK_OD based on the falling edge of the first clock CK1. In an example, the first sampling control signal CK_OD is shown to include 16 pulses, and rising edges of the pulses are only shown with arrows for simplicity of illustration. A time between rising edges of two adjacent pulses may be τ.

The delay chain 110 may generate the second sampling control signal CK_EV based on the rising edge of the first clock CK1. In an example, the second sampling control signal CK_EV is shown to include 16 pulses, and rising edges of the pulses are only shown with arrows for simplicity of illustration. A time between rising edges of two adjacent pulses may be τ.

The edge detector 120 may sample the first clock CK1 using the first sampling control signal CK_OD. A period sampled by the first sampling control signal CK_OD of the first clock CK1 is marked with hatching. As a result of the sampling, a logic low period of the first clock CK1 may be sampled to "0" and a logic high period of the first clock CK1 may be sampled to "1". However, a logic low period after the hatched logic high period of the first clock CK1 is sampled to "1" because the sampled "1" in the logic high period is fixed.

As the sampling result of the first clock CK1, the first sampling signal QNR_OD configured to bits "0001111111111111" may be output. The first sampling signal QNR_OD may include information on a timing at which the first clock CK1 transits from the logic low to the logic high. (e.g., a time point at which a bit "0" is changed to a bit "1")

The edge detector 120 may sample the second clock CK2 using the second sampling control signal CK_EV. As the sampling result of the second clock CK2, the second sampling signal QNR_EV configured to bits "0000000111111111" may be output. The second sampling signal QNR_EV may include information on a timing at which the second clock CK2 transits from the logic low to the logic high. (e.g., a time point at which a bit "0" is changed to a bit "1").

Figure 6:
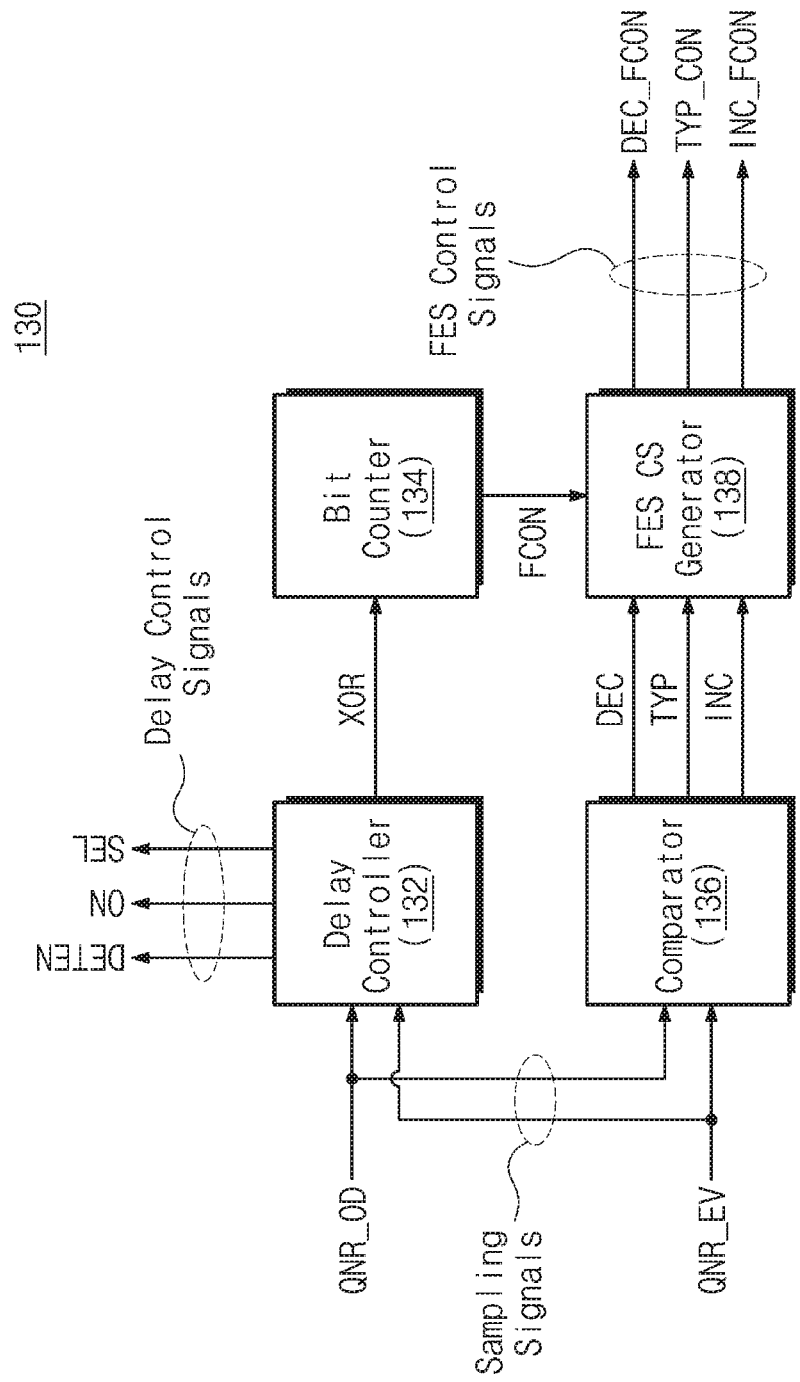
FIG. 6 is a block diagram illustrating an example configuration of the FES controller shown in FIG. 5.

FIG. 6 is a block diagram illustrating an example configuration of the FES controller 130 shown in FIG. 5. The FES controller 130 may include a delay controller 132, a bit counter 134, a comparator 136, and a FES control signal (CS) generator 138. According to some example embodiments, the delay controller 132, the bit counter 134, the comparator 136, and the FES CS generator 138 may be implemented using hardware (e.g., circuitry) as discussed further below.

The delay controller 132 may generate the delay control signals based on the first sampling signals QNR_OD and the second sampling signals QNR_EV. The delay control signals may include the mask signal DETEN, an on signal ON, and a selection signal SEL. The mask signal DETEN is a signal defining the detection period and the duty correction period. The on signal ON and the selection signal SEL may be used to activate the logic gates of the delay chain 110. An operation in which the delay chain 110 is controlled by the on signal ON and the selection signal SEL will be described in detail with reference to FIG. 8.

The delay controller 132 may perform an exclusive OR operation XOR on the first sampling signals QNR_OD and the second sampling signals QNR_EV.

The bit counter 134 may count the number of the bits "1" included in a result of the exclusive OR operation XOR. The counting result may be output as a counting signal FCON. The number of the bits "1" included in the result of the exclusive OR operation XOR may include information on a pulse width to be modulated. According to some example embodiments, "0" and "1" may be referred to as defined values of the bits.

The comparator 136 may compare the first sampling signals QNR_OD with the second sampling signals QNR_EV to determine a direction in which the falling edge of the clock is modulated. For example, when a duty ratio is 50%, a length of the logic high period of the first clock CK1 is equal to a length of the logic low period of the first clock CK1. However, when the duty ratio is not 50%, the length of the logic high period of the first clock CK1 is different from the length of the logic low period of the first clock CK1. Therefore, information on the direction in which the falling edge of the clock is modulated may be obtained from a difference between the logic high period of the first clock CK1 and the logic low period of the first clock CK1.

The comparator 136 may generate first, second, and third direction signals DEC, TYP, INC based on a result of comparing the first sampling signals QNR_OD and the second sampling signals QNR_EV. The first direction signal DEC is a signal indicating that the duty cycle of the first clock CK1 should be decreased. The second direction signal TYP is a signal indicating that the duty cycle of the first clock CK1 is within an allowable range. The third direction signal INC is a signal indicating that the duty cycle of the first clock CK1 should be increased.

The FES control signal generator 138 may generate first, second, and third FES control signals DEC_FCON, TYP_CON, INC_FCON based on the first, second, and third direction signals DEC, TYP, INC. The first FEM core 140 may be controlled by the first FES control signal DEC_FCON so that the duty cycle of the first clock CK1 may be decreased. That is, the falling edge of the first clock CK1 may be advanced. The duty cycle of the first clock CK1 may be maintained by the second FES control signal TYP_CON. The first FEM core 140 may be controlled by the third FES control signal INC_FCON so that the duty cycle of the first clock CK1 may be increased. That is, the falling edge of the first clock CK1 may be delayed.

Figure 7:
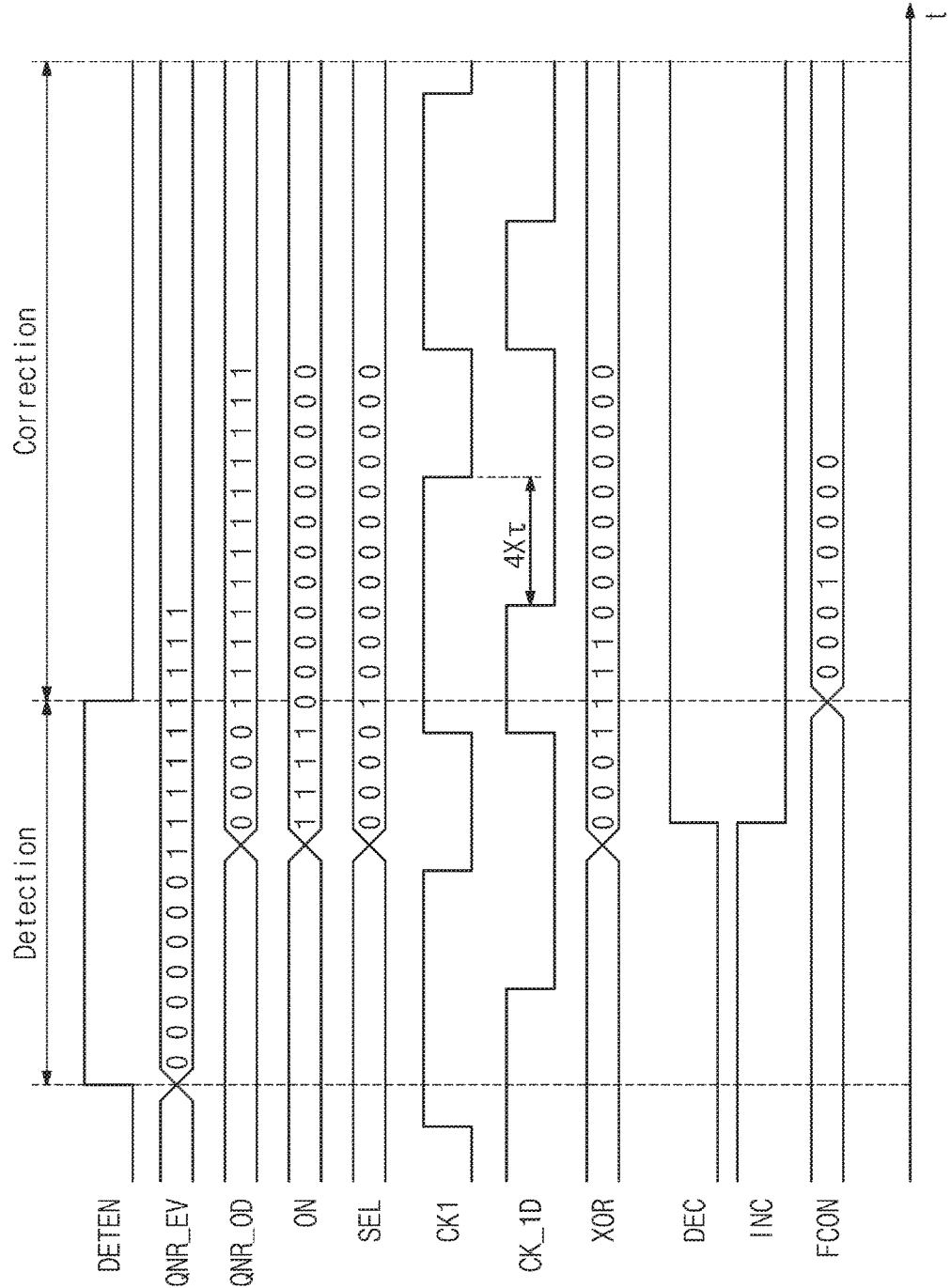
FIG. 7 is a timing diagram illustrating a process of determining a width to which the falling edge of the first clock should be modulated.

FIG. 7 is a timing diagram illustrating a process of determining a width to which the falling edge of the first clock CK1 should be modulated. For better understanding, FIGS. 2 and 6 will be referred to and described together.

The mask signal DETEN may be activated by the delay controller 132. The mask signal DETEN may be generated to be active for one period of the first clock CK1. The duty cycle corrector 100 may detect the duty error of the first clock CK1 in the period in which the mask signal is activated and may correct the duty cycle of the first clock CK1 in the period in which the mask signal is inactivated.

The on signal ON may be activated in the detection period. For example, the delay controller 132 receives the first sampling signal QNR_OD and the second sampling signal QNR_EV, and then may generate bits "1" during the detection period. Thereafter, the delay controller 132 may generate bits "0" in the correction period. The number of bits of the on signal ON may be equal to the number of bits of each of the first sampling signal QNR_OD and the second sampling signal QNR_EV.

If the number of the bits "1" of the on signal ON is relatively large, the delay clock CK1_D may be delayed relatively more by the delay chain 110. On the contrary, if the number of the bits "1" of the on signal ON is relatively small, the delay clock CK1_D may be delayed relatively less by the delay chain 110.

The selection signal SEL may include a bit "1" when the bit of the on signal ON transits from "1" to "0". For example, referring to FIG. 7, since the on signal ON is configured to bits "1111000000000000", the selection signal SEL may be configured to bits "0000100000000000".

That the delay chain 110 generates the delay clock CK1_D using the on signal ON and the selection signal SEL will be described in detail with reference to FIG. 8.

The result of the exclusive OR operation XOR may be a result of an exclusive OR operation on the first sampling signal QNR_OD and the second sampling signal QNR_EV. The result of the exclusive OR operation XOR may include information on a difference between the logic high period of the first clock CK1 and the logic low period of the first clock CK1. For example, the number of bits "0" of the first sampling signal QNR_OD may correspond to a length of the logic low period of the first clock CK1 and the number of bits "0" of the second sampling signal QNR_EV may correspond to a length of the logic high period of the first clock CK1.

Therefore, the result of the exclusive OR operation XOR on the first sampling signal QNR_OD and the second sampling signal QNR_EV may include information on a length of the duty cycle to be modulated. In detail, the number of bits "1" in the result of the exclusive OR operation XOR may be twice the duty cycle to be increased or decreased. That is, the number 4 of the bits "1" in the result of the exclusive OR operation XOR may correspond to the difference (4×τ) between the logic high period of the first clock CK1 and the logic low period of the first clock CK1.

The first, second, and third direction signals DEC, TYP, INC may include information on a modulation direction of the duty cycle. For example, the first, second, and third direction signals DEC, TYP, INC may be generated by comparing the first sampling signal QNR_OD with the second sampling signal QNR_EV. The number of the bits "0" of the first sampling signal QNR_OD may correspond to a length of the logic low period of the first clock CK1 and the number of the bits "0" of the second sampling signal QNR_EV may correspond to a length of the logic high period of the first clock CK1.

Therefore, as shown FIG. 7, if the number of the bits "0" of the first sampling signal QNR_OD is less than the number of the bits "0" of the second sampling signal QNR_EV, this indicates that the duty cycle should be decreased. In this case, the comparator 136 generates the first direction signal DEC that is a logic high and the third direction signal INC that is a logic low. A time point at which the first direction signal DEC transits to the logic high and a time point at which the third direction signal INC transits to the logic low are substantially similar to or the same as a time at which the first sampling signal QNR_OD is input to the comparator 136.

On the contrary, unlike that shown in FIG. 7, if the number of the bits "0" of the first sampling signal QNR_OD is greater than the number of the bits "0" of the second sampling signal QNR_EV, this indicates that the duty cycle should be increased. In this case, the comparator 136 generates the first direction signal DEC that is a logic low and the third direction signal INC that is a logic high. As a result, the duty cycle of the first clock CK1 is increased.

Finally, if the number of the bits "0" of the first sampling signal QNR_OD is equal to the number of the bits "0" of the second sampling signal QNR_EV, this indicates that the duty cycle should be maintained. In this case, although not shown in FIG. 7, the comparator 136 generates the second direction signal TYP that is a logic high, the first direction signal DEC that is the logic low, and the third direction signal INC that is a logic low.

The counting signal FCON may include information on the number of the bits "1" included in the result of the exclusive OR operation XOR. As described above, since the number of the bits "1" included in the result of the exclusive OR operation XOR may include information on a pulse width to be modulated, the counting signal FCON may be used to generate the first, second, and third FES control signals DEC_FCON, TYP_CON, and INC_FCON together with any one of the first, second, and third direction signals DEC, TYP, INC. An operation generating the first, second, and third FES control signals DEC_FCON, TYP_CON, and INC_FCON will be described in detail with reference to FIGS. 9 to 11.

Figure 8:
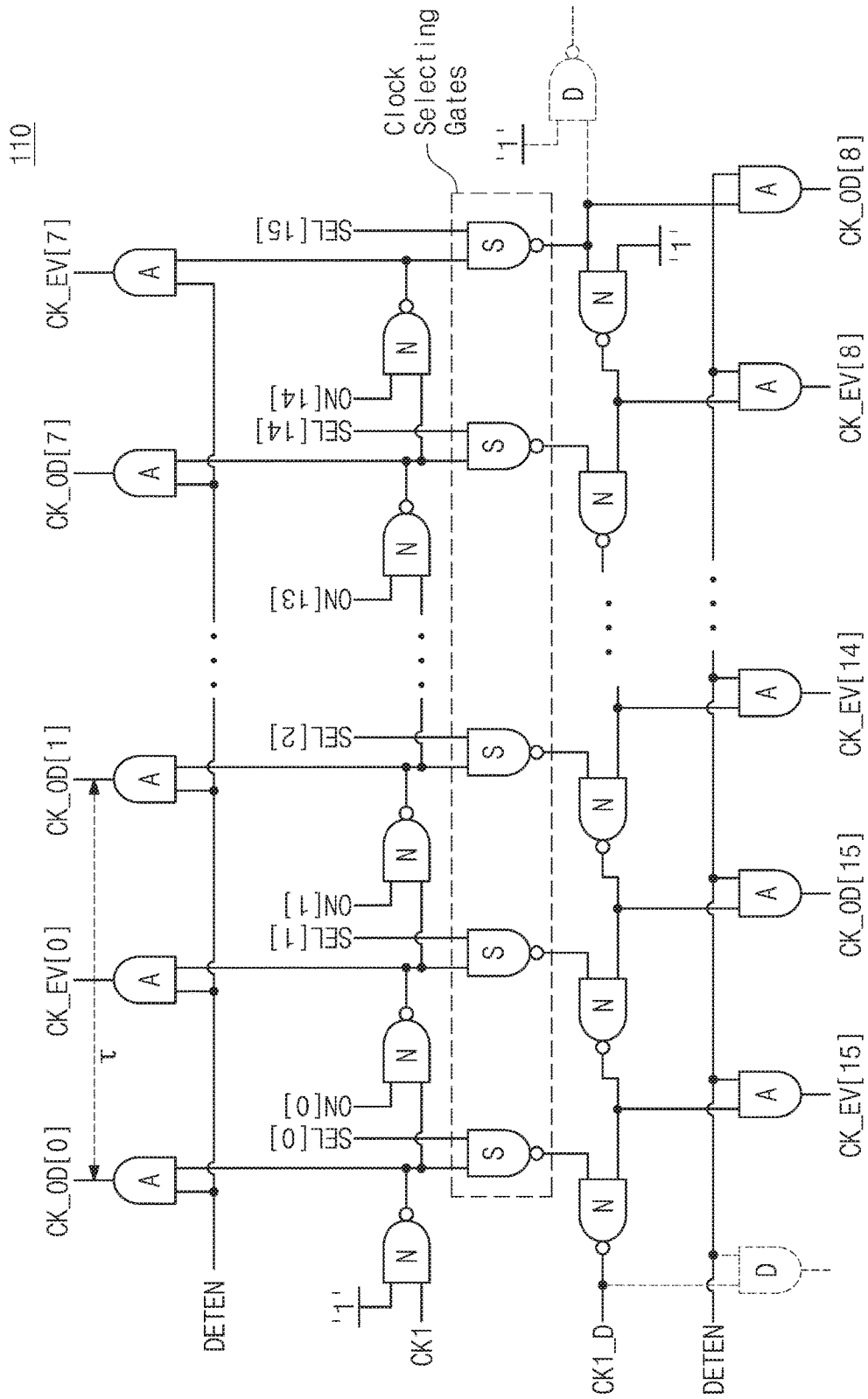
FIG. 8 is a circuit diagram illustrating a detailed configuration of the delay chain shown in FIG. 2.

FIG. 8 is a circuit diagram illustrating a detailed configuration of the delay chain 110 shown in FIG. 2. For better understanding, FIGS. 5 to 7 will be referred to and described together.

The delay chain 110 may include a plurality of AND gates and a plurality of NAND gates. AND gates marked as "A" are gates for outputting the first sampling control signal CK_OD and the second sampling control signal CK_EV. NAND gates marked as "N" are gates associated with the delay chain 110 for receiving the on signal ON and the selection signal SEL to generate the delay clock CK1_D. According to some example embodiments, the NAND gates marked "N" may be connected in series. NAND gates marked as "S" are gates associated with adjusting the delay length. NAND gates marked as "D" are gates associated with a fan out of the delay chain 110 and for a load balancing. NAND gates marked as "D" may be omitted.

The configuration of the delay chain 110 will be described by applying the timing diagram shown in FIG. 7 to the delay chain 110 shown in FIG. 8. Since the on signal ON is configured to the bits "1111000000000000", ON[0] to ON[3] which are a logic "1" and ON[4] to ON[15] which are a logic "0" may be input to the NAND gates marked as "N". Since the selection signal SEL is configured to the bits "0000100000000000", SEL[4] which are the logic "1" and SEL[0] to SEL[3] and SEL[5] to SEL[15] which are the logic "0" may be input to the NAND gates marked as "S." Consequently, a delay chain may be formed so that the first clock CK1 passes through 11 NAND gates. NAND gates to which ON[2], ON[3], SEL[3], SEL[4], etc. are input are not shown because of the size of the figure.

A propagation delay of the first sampling control signal CK_OD output from the delay chain 110 may be τ. That is, for example, a delay between CK_OD[0] and CK_OD[1] of the first sampling control signal CK_OD may be τ. Similarly, a propagation delay of the second sampling control signal CK_EV output from the delay chain 110 may be τ.

According to this configuration, a length of the delay chain for delaying the first clock CK1 may be easily adjusted according to the number of the bits "1" configuring the on signal ON. Since gates to which the bits 0 configuring the on signal ON are input are turned off, the power consumption may be reduced.

Figure 9:
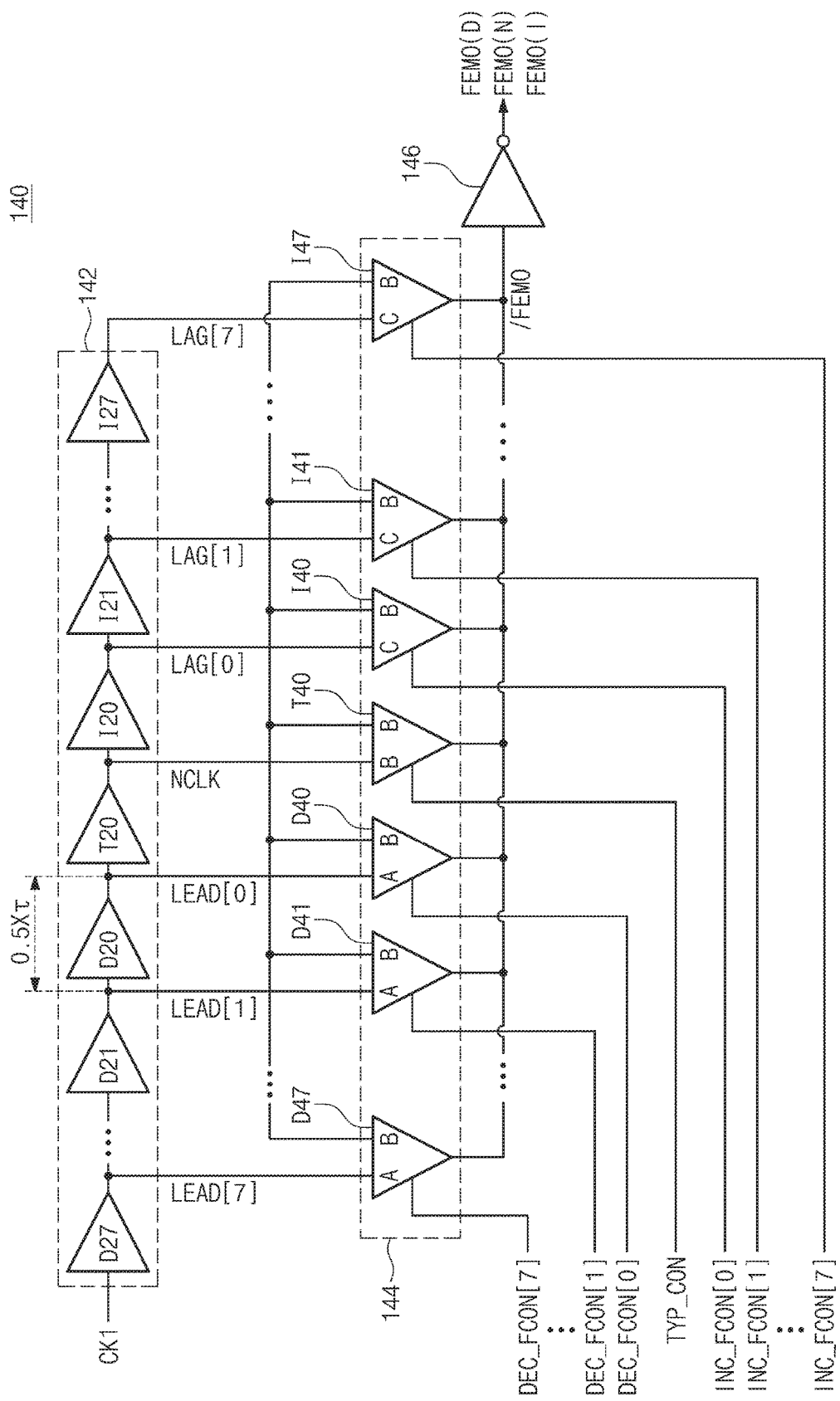
FIG. 9 is a circuit diagram illustrating an example configuration of the first FEM core shown in FIG. 2.

FIG. 9 is a circuit diagram illustrating an example configuration of the first FEM core 140 shown in FIG. 2. The first FEM core 140 may include a plurality of first inverters 142, a plurality of falling edge modulation units 144, and a second inverter 146. The first inverters 142 may include inverters D20 to D27, T20, and 120 to 127. According to some example embodiments, the first inverters 142 may be connected in series. The falling edge modulation units 144 may include first falling edge modulation units D40 to D47, a second falling edge modulation unit T40, and third falling edge modulation units 140 to 147.

The inverters D20 to D27, T20, and 120 to 127 are inverters associated with delaying the falling edge of the first clock CK1. Each of the inverters D20 to D27, T20, and 120 to 127 may output delayed signals LEAD[0] to LEAD[7], NCLK, and LAG[0] to LAG[7]. The signal LEAD[7] may be the least delayed signal, and the signal LAG[7] may be the most delayed signal.

For example, a propagation delay between outputs of two inverters adjacent to each other of the inverters D20 to D27, T20, and I20 to I27 may be 0.5×τ. However, the propagation delay may not be 0.5×τ. For example, within an interpolating range where a linearity of the phase interpolator 150 shown in FIG. 1 is known, the propagation delay may be various values around 0.5×τ.

According to the configuration of the first FEM core 140, NCLK among signals output from the first inverters 142 may be assumed to be a reference clock. That is, NCLK may be a clock whose the falling edge of the first clock CK1 is not modulated. According to this assumption, the signals LEAD[0] to LEAD[7] may be clocks whose the falling edge is advanced (e.g., the duty cycle is decreased) and the signals LAG[0] to LAG[7] may be clocks whose the falling edge is delayed (e.g., the duty cycle is increased).

The falling edge modulation units 144 are inverters associated with setting a path of the delay chain in which the first clock CK1 is delayed. For example, the first falling edge modulation units D40 to D47 may be activated by the first FES control signals DEC_FCON[0] to DEC_FCON[7]. The second falling edge modulation unit T40 may be activated by the second FES control signal TYP. The third falling edge modulation units I40 to I47 may be activated by the third FES control signals INC_FCON[0] to INC_FCON[7], respectively.

It is assumed that the duty cycle of the first clock CK1 should be decreased. For better understanding, referring to the timing diagram shown in FIG. 7, in this case, the FES control signal generator 138 may generate the first FES control signal DEC_FCON using the first direction signal DEC and the counting signal FCON. Since the first FES control signal DEC_FCON is configured to bits "00010000" and includes direction information to decrease the duty cycle, the bits "00010000" are sequentially input to the first falling edge modulation units D40 to D47, and a falling edge modulation unit D44 to which a bit "1" is input may be activated.

As a result, a delay chain to which the inverters D27 to D24, the second falling edge modulation unit D44, and the second inverter 146 are connected may be formed. The first clock CK1 may be delayed through the delay chain D27 to D24, D44, and the second inverter 146, and the first falling edge modulation signal FEMO(D) may be output. D in the parentheses indicates "decrease".

If it is determined that the duty cycle of the first clock CK1 should not be corrected, the second falling edge modulation unit T40 may be activated by the second FES control signal TYP_CON, and the second falling edge modulation signal FEMO(N) may be output. N in the parentheses indicates "neutral".

It is assumed that the duty cycle of the first clock CK1 should be increased. In this case, the FES control signal generator 138 may generate the third FES control signal INC_FCON using the third direction signal INC and the counting signal FCON. For example, if the third FES control signal INC_FCON is configured to bits "10000000", the bits "10000000" are sequentially input to the third falling edge modulation units I40 to I47, and a falling edge modulation unit I40 to which a bit "1" is input may be activated.

As a result, a delay chain to which the inverters D27 to D20, T20, and I20, the third falling edge modulation unit I40, and the second inverter 146 are connected may be formed. The first clock CK1 may be delayed through the delay chain D27 to D20, T20, I20, I40, and the second inverter 146, and the third falling edge modulation signal FEMO(I) may be output. I in the parentheses indicates "increase."

The second inverter 146 may be configured to generate the falling edge modulation signal FEMO using signal/FEMO output from the falling edge modulation units D40 to D47, T40, and I40 to I47. For example, the second inverter 146 is configured to various logic elements to invert signal/FEMO output from the falling edge modulation units D40 to D47, T40, and I40 to I47.

Figure 10:
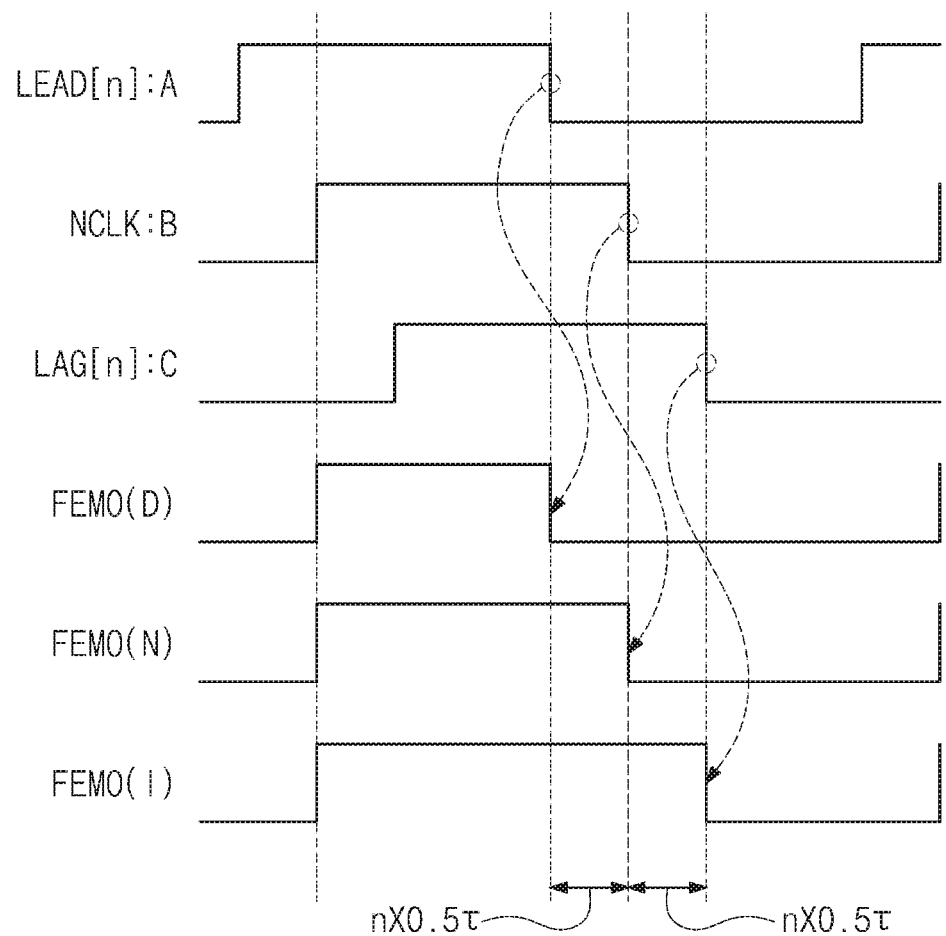
FIG. 10 is a timing diagram illustrating signal processing by the falling edge modulation units shown in FIG. 9.

FIG. 10 is a timing diagram illustrating signal processing by the falling edge modulation units 144 shown in FIG. 9. For better understanding, FIGS. 7 to 9 will be referred to and described together.

In a signal LEAD[n], "n" corresponds to a bit "1" of the counting signal FCON. "n" is a natural number 0 to 7. "A" added in the signal LEAD[n] indicates input terminals of the first falling edge modulation units D40 to D47. "B" added in a signal NCLK indicates input terminals of the first falling edge modulation units D40 to D47, the second falling edge modulation unit T40 and the third falling edge modulation units I40 to I47. In a signal LAG[n], "n" corresponds to a bit "1" of the counting signal FCON. "n" is a natural number 0 to 7. "C" added in the signal LAG[n] indicates input terminals of the third falling edge modulation units I40 to I47.

For example, if it is determined that the duty cycle of the first clock CK1 should be decreased, the signal LEAD[n] may be generated within the first FES core 140. An activated falling edge modulation unit of the first falling edge modulation units D40 to D47 may perform an AND operation on the signal LEAD[n] and the signal NCLK. As a result, the falling edge modulation signal FEMO(D) in which the falling edge is advanced may be generated.

On the contrary, if it is determined that the duty cycle of the first clock CK1 should be increased, the signal LAG[n] may be generated within the first FES core 140. An activated falling edge modulation unit of the third falling edge modulation units I40 to I47 may perform an OR operation on the signal LAG[n] and the signal NCLK. As a result, the falling edge modulation signal FEMO(I) in which the falling edge is delayed may be generated.

Figure 11A:
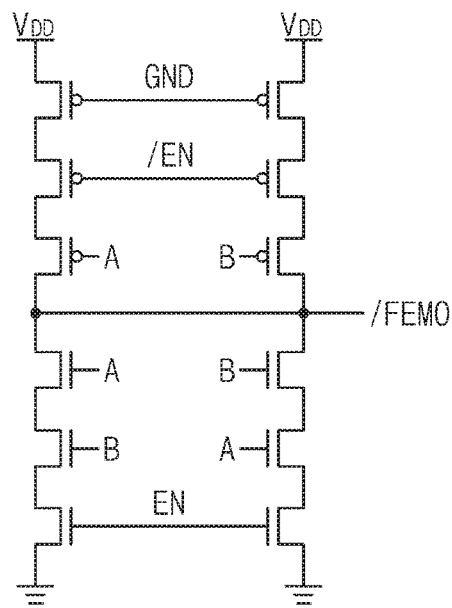
FIG. 11A is a circuit diagram illustrating an example configuration of the first falling edge modulation units.
Figure 11B:
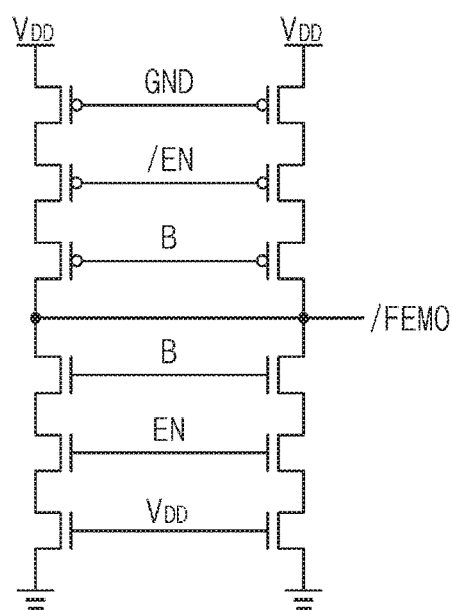
FIG. 11B is a circuit diagram illustrating an example configuration of the second falling edge modulation units.
Figure 11C:
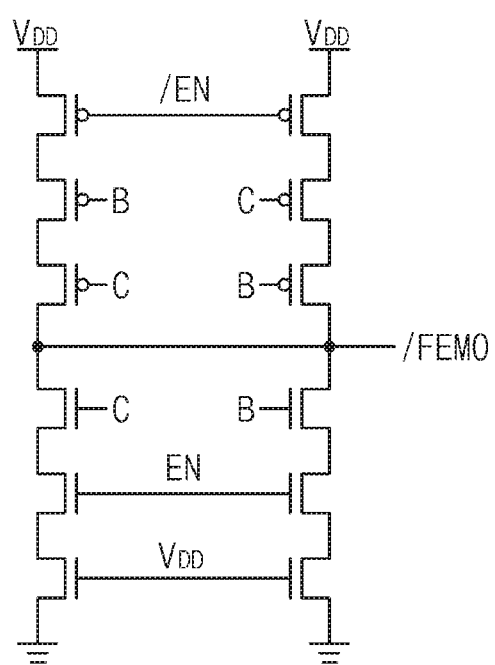
FIG. 11C is a circuit diagram illustrating an example configuration of the third falling edge modulation units.

FIG. 11A is a circuit diagram illustrating an example configuration of the first falling edge modulation units D40 to D47. FIG. 11B is a circuit diagram illustrating an example configuration of the second falling edge modulation units T40. FIG. 11C is a circuit diagram illustrating an example configuration of the third falling edge modulation units I40 to I47.

Referring to FIGS. 11A to 11C, VDD is a power supply voltage, GND is a ground voltage, and NMOS transistors and PMOS transistors may be turned on by active signals EN and /EN. A, B, and C indicate input terminals of the falling edge modulation units.

According to a configuration shown in FIG. 11A, the AND operation on the signal LEAD[n] and the signal NCLK may be performed. As a result, the first falling edge modulation signal FEMO(D) in which the falling edge is advanced may be generated. According to a configuration shown in FIG. 11B, the signal NCLK may be output without modulation. As a result, the second falling edge modulation signal FEMO(N) in which the falling edge is maintained may be generated. According to a configuration shown in FIG. 11C, the OR operation on the signal LAG[n] and the signal NCLK may be performed. As a result, the third falling edge modulation signal FEMO(I) in which the falling edge is delayed may be generated.

However, the circuit diagrams shown in FIGS. 11A to 11C are examples, some example embodiments are not limited thereto, and may be configured with various circuits to perform the AND operation and the OR operation.

The configuration and the operation of the first FEM core 140 are described with reference to FIG. 9 to FIG. 11C. A configuration and an operation of the second FEM core 145 is substantially similar to or the same as that of the first FEM core 140, but the second FEM core 145 may operate in opposition to the first FEM core 140. For better understanding, referring to FIG. 2, the non-inverted first clock CK1 is input to the first FEM core 140, but the inverted and delayed delay clock CK1_D is input to the second FEM core 145. Therefore, when the first FEM core 140 may perform the operation to advance the falling edge, the second FEM core 145 may perform the operation to delay the falling edge.

The first to third FES control signals may be applied to the second FEM core 145 so that the second FEM core 145 operates in opposition to the first FEM core 140. For example, referring to FIG. 9, unlike the one shown in FIG. 9, the third FES control signal INC_FCON may be applied to the first falling edge modulation units D40 to D47 and the first FES control signal DEC_FCON may be applied to the third falling edge modulation units I40 to I47.

However, a configuration for operating the first FEM core 140 and the second FEM core 145 to be opposite to each other is not limited thereto. For example, the first, second, and third direction signals DEC, TYP, INC including information on the modulation direction of the falling edge may be reversely manipulated and the FES control signals input to the second FEM core 145 may be separately generated. In addition, one of ordinary skill in the art would understand that various techniques would be applicable in some example embodiments.

Figure 12:
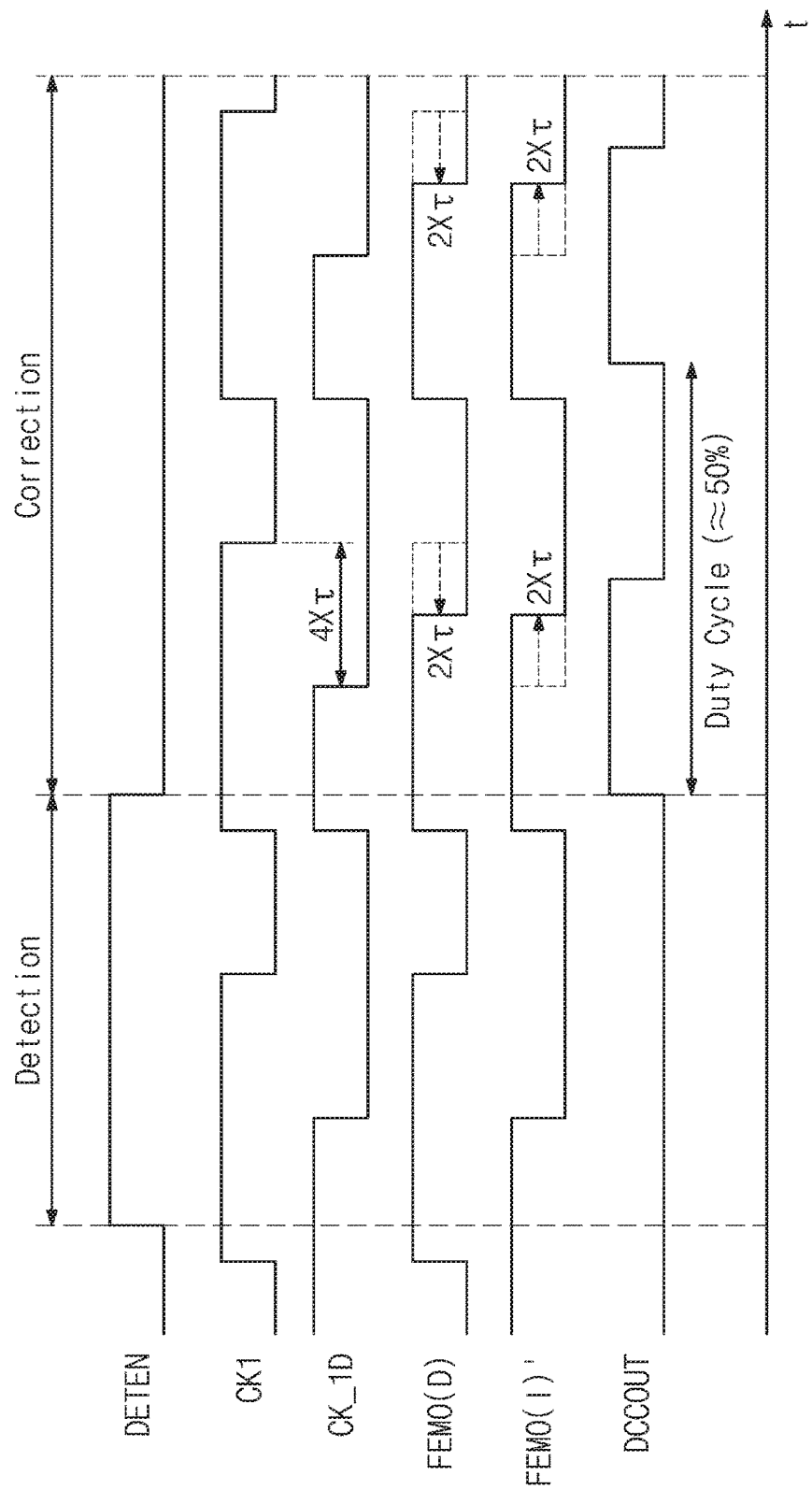
FIG. 12 is a timing diagram illustrating interpolation performed based on the falling edge modulation signals generated by the first FEM core and the second FEM core.

FIG. 12 is a timing diagram illustrating interpolation performed based on the falling edge modulation signals generated by the first FEM core 140 and the second FEM core 145.

Referring to FIG. 12, a difference between the logic high period and the logic low period of the first clock CK1 is 4×τ. Also, a falling edge of the falling edge modulation signal FEMO(D) output from the first FEM core 140 is advanced by 2×τ and a falling edge of the falling edge modulation signal FEMO(I)' output from the second FEM core 145 is delayed by 2×τ.

The phase interpolator 150 shown in FIG. 2 may perform the interpolating using the falling edge modulation signals FEMO(D) and FEMO(I). As a result, a duty cycle correction signal DCCOUT having an average duty cycle of about 50% may be output. Since a detailed operation of the phase interpolator 150 is well known of those skilled in the art and a detailed description thereof will be omitted.

Figure 13:
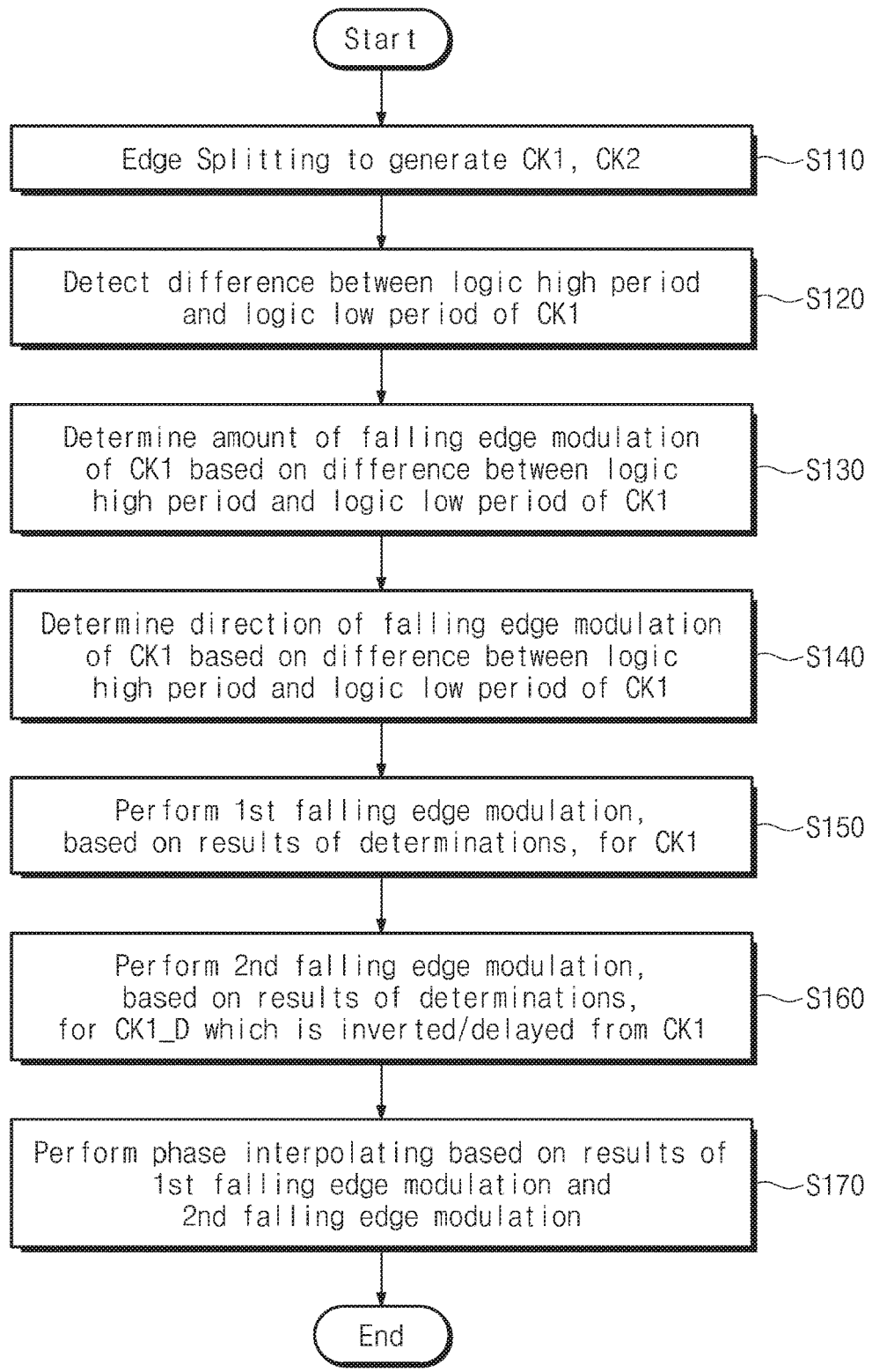
FIG. 13 is a flowchart illustrating a method to correct the duty cycle.

FIG. 13 is a flowchart illustrating a method to correct the duty cycle.

In operation S110, an edge splitting may be performed. For example, the edge splitter 105 shown in FIG. 3 receives the reference clock Ref CK or the first clock CK1 and may generate the second clock CK2 having an opposite phase.

In operation S120, the difference between the logic high period and the logic low period of the first clock CK1 may be detected. If there is no difference between the logic high period and the logic low period, the duty cycle should not be corrected. On the contrary, if there is the difference between the logic high period and the logic low period, the duty cycle should be corrected.

For example, the difference between the logic high period and the logic low period of the first clock CK1 may be obtained by sampling the first clock CK1. For example, the logic high period of the first clock CK1 may be calculated by sampling the logic low period of the second clock CK2 using a plurality of clocks (for example, the second sampling control signal CK_EV shown FIG. 5) having the propagation delay constant τ. The logic low period of the first clock CK1 may be calculated by sampling the logic low period of the first clock CK1 using a plurality of clocks (for example, the first sampling control signal CK_OD shown FIG. 5) having the propagation delay constant τ.

For example, a length corresponding to bits "1" of the result of an exclusive OR operation on sampling values may correspond to the difference between the logic high period and the logic low period of the first clock CK1.

In operation S130, the amount of the falling edge modulation to be performed on the first clock CK1 may be determined. If there is a difference between the logic high period and the logic low period, the duty cycle should be corrected by ½ of the difference value.

In operation S140, the direction of the falling edge modulation to be performed on the first clock CK1 may be determined. In operation S120, if the sampling value of the logic high period of the first clock CK1 is compared with the sampling value of the logic low period of the first clock CK1, it may be determined whether the falling edge of the first clock CK1 should be advanced or delayed.

For example, if the falling edge of the first clock CK1 should be advanced, the first direction signal DEC may be activated, and if the falling edge of the first clock CK1 should be delayed, the third direction signal INC may be activated. If the falling edge of the first clock CK1 should not be modulated, the second direction signal TYP may be activated.

In operation S150, a first falling edge modulation for the first clock CK1 may be performed. The first FEM core 140 shown in FIG. 2 may advance or delay the falling edge of the first clock CK1 based on the amount of the modulation determined in the operation S130 and the direction of the modulation determined in the operation S140. The clock in which the falling edge is modulated may be obtained by performing the AND operation or the OR operation by the example circuit shown in FIGS. 11A to 11C.

In operation S160, a second falling edge modulation for the delay clock CK1_D which is inverted or delayed from the first clock CK1 may be performed. The second FEM core 145 shown in FIG. 2 may advance or delay the falling edge of the delay clock CK1_D based on the amount of the modulation determined in the operation S130 and the direction of the modulation determined in the operation S140. However, since the second FEM core 145 operates in opposition to the first FEM core 140, the FES signals may be applied to the second FEM core as opposed to the first FEM core 140.

In operation S170, a phase interpolation may be performed. For example, the phase interpolator 150 shown in FIG. 2 may perform the phase interpolation on the outputs of the first FEM core 140 and the second FEM core 145. As a result, the duty cycle correction signal DCCOUT having the average duty cycle of about 50% may be output.

According to some example embodiments, since falling edges of clocks are adjusted before performing the phase interpolating, the linearity of the interpolating may be known. In addition, since the falling edge modulating operations are respectively performed in different directions using the first FEM core 140 and the second FEM core 145, when the phase interpolating is performed, the effect of variations in a manufacturing process, a voltage, and a temperature may be offset. Consequently, the reliability and the speed of the duty cycle correction may be improved.

While some example embodiments have been described, it will be apparent to those of ordinary skill in the art that various changes and modifications may be made thereto without departing from the spirit and scope the example embodiments as set forth in the following claims.

What is claimed is:

1. A duty cycle corrector comprising:
    a delay chain configured to,
        delay a first clock to generate a delay clock, and
        generate a first sampling control signal based on a first edge of the first clock and a second sampling control signal based on a second edge of the first clock;
    an edge detector configured to,
        sample the first clock using the first sampling control signal to obtain a first sampling signal, and
        sample a second clock having an opposite phase to the first clock using the second sampling control signal to obtain a second sampling signal;
    a falling edge shift (FES) controller configured to determine a modulation direction and a modulation width of the first edge of the first clock based on the first sampling signal and the second sampling signal;
    a plurality of falling edge modulator (FEM) cores configured to,
        first modulate the first edge of the first clock to obtain a first modulation result, and
        second modulate a first edge of the delay clock to obtain a second modulation result, the first modulation and the second modulation being performed using the modulation direction and the modulation width; and
    a phase interpolator configured to perform phase interpolation on the first modulation result and the second modulation result.

2. The duty cycle corrector of claim 1, wherein the FES controller is further configured to generate delay control signals for controlling a delay amount of the first clock.

3. The duty cycle corrector of claim 2, wherein,
    the delay chain includes a plurality of logic gates configured to delay the first clock, the plurality of logic gates being connected in series, and
    a number of the plurality of logic gates used to delay the first clock is adjusted by the delay control signals.

4. The duty cycle corrector of claim 3, wherein the delay chain is further configured to output signals generated by each of the plurality of logic gates, the output signals including the first sampling control signal and the second sampling control signal.

5. The duty cycle corrector of claim 4, wherein each of the plurality of logic gates is a NAND gate.

6. The duty cycle corrector of claim 2, wherein the FES controller comprises:
    a delay controller configured to,
        generate the delay control signals based on the first sampling signal and the second sampling signal, and
        perform an exclusive OR operation on the first sampling signal and the second sampling signal to generate an exclusive OR result;
    a comparator configured to compare the first sampling signal with the second sampling signal to generate a direction signal associated with the modulation direction;
    a bit counter configured to count a number of bits having a defined value in the exclusive OR result to obtain a counting result; and
    a FES control signal generator configured to generate a FES control signal including the modulation direction and the modulation width, the modulation direction being based on the direction signal and the modulation width being based on the counting result.

7. The duty cycle corrector of claim 1, wherein the plurality of FEM cores include a first FEM core configured to perform the first modulation, the first FEM core including,
    a plurality of inverters connected in series, the plurality of inverters being configured to delay the first edge of the first clock, and
    a plurality of falling edge modulation units each of which being configured to be connected to an output terminal of each of the plurality of inverters to control a width at which the first edge of the first clock is delayed.

8. The duty cycle corrector of claim 7, wherein the plurality of falling edge modulation units comprises:
    a plurality of first falling edge modulation units configured to advance a falling edge of the first clock;
    a second falling edge modulation unit configured to maintain the falling edge of the first clock; and
    a plurality of third falling edge modulation units configured to delay the falling edge of the first clock.

9. The duty cycle corrector of claim 8, wherein each of the first falling edge modulation units is configured to perform an AND operation on a lead signal output from one of the plurality of inverters corresponding to the first falling edge modulation units and a neutral signal output from an inverter of the plurality of inverters corresponding to the second falling edge modulation unit.

10. The duty cycle corrector of claim 8, wherein each of the third falling edge modulation units is configured to perform an OR operation on a lag signal output from one of the plurality of inverters corresponding to the third falling edge modulation units and a neutral signal output from an inverter of the plurality of inverters corresponding to the second falling edge modulation unit.

11. The duty cycle corrector of claim 1, further comprising:
    an edge splitter configured to generate the second clock based on the first clock.

12. A duty cycle corrector comprising:
    a falling edge shift controller configured to determine a modulation direction and a modulation width of a falling edge of a first clock based on a difference between a logic high period and a logic low period of the first clock;
    a first falling edge modulator core configured to modulate the falling edge of the first clock based on a result of the determination to obtain a first modulation result;
    a second falling edge modulator core configured to modulate a falling edge of a second clock inverted and delayed from the first clock based on the result of the determination to obtain a second modulation result; and
    a phase interpolator configured to perform a phase interpolation on the first modulation result and the second modulation result.

13. The duty cycle corrector of claim 12, further comprising:
a delay chain configured to generate the second clock by inverting and delaying the first clock.

14. The duty cycle corrector of claim 13, wherein the delay chain comprises a plurality of logic gates configured to adjust a degree to which the first clock is delayed based on a control signal output by the falling edge shift controller.

15. The duty cycle corrector of claim 12, wherein each of the first falling edge modulator core and the second falling edge modulator core comprises:
a plurality of inverters connected in series, the plurality of inverters being configured to delay the falling edge of the first clock; and
a plurality of falling edge modulation units each of which being configured to be connected to an output terminal of each of the plurality of inverters to control a width at which the falling edge of the first clock is delayed.

16. The duty cycle corrector of claim 12, wherein the second falling edge modulator core is configured to,
delay a phase of the second clock when the first falling edge modulator core advances a phase of the first clock, and
advance the phase of the second clock when the first falling edge modulator core delays the phase of the first clock.

17. A method performed by a duty cycle corrector for correcting a duty cycle of a first clock comprising:
detecting a difference between a logic high period and a logic low period of the first clock;
determining a modulation direction and a modulation width of a falling edge of the first clock based on the difference;
first modulating the falling edge of the first clock based on a result of the determination;
second modulating a falling edge of a second clock inverted and delayed from the first clock based on the result of the determination; and
performing a phase interpolation based on the first modulating and the second modulating.

18. The method of claim 17, wherein the determining comprises comparing bit values of a result of sampling the logic high period of the first clock with bit values of a result of sampling the logic low period of the first clock.

19. The method of claim 18, wherein the determining further comprises performing an exclusive OR operation on the bit values of the result of sampling the logic high period of the first clock and the bit values of the result of sampling the logic low period of the first clock.

20. The method of claim 17, wherein the first modulating and the second modulating include modulating the falling edge of the first clock in an opposite direction to the falling edge of the second clock.

* * * * *